(12) United States Patent
Ha et al.

(10) Patent No.: US 11,672,132 B2
(45) Date of Patent: Jun. 6, 2023

(54) VARIABLE RESISTANCE MEMORY DEVICE

(71) Applicant: Samsung Electronics Co., Ltd., Suwon-si (KR)

(72) Inventors: Tae Hong Ha, Suwon-si (KR); Jae Rok Kahng, Seoul (KR)

(73) Assignee: Samsung Electronics Co., Ltd.

( * ) Notice: Subject to any disclaimer, the term of this patent is extended or adjusted under 35 U.S.C. 154(b) by 159 days.

(21) Appl. No.: 17/359,799

(22) Filed: Jun. 28, 2021

(65) Prior Publication Data

US 2022/0013581 A1  Jan. 13, 2022

(30) Foreign Application Priority Data

Jul. 9, 2020 (KR) .................. 10-2020-0084603
Feb. 3, 2021 (KR) .................. 10-2021-0015409

(51) Int. Cl.
*H10B 63/00* (2023.01)
*H01L 27/24* (2006.01)
*H01L 45/00* (2006.01)

(52) U.S. Cl.
CPC ........ *H01L 27/249* (2013.01); *H01L 45/1233* (2013.01); *H01L 45/06* (2013.01); *H01L 45/144* (2013.01)

(58) Field of Classification Search
CPC .................................................. H10B 63/00
See application file for complete search history.

(56) References Cited

U.S. PATENT DOCUMENTS

| | | | |
|---|---|---|---|
| 8,593,869 B2 | 11/2013 | Tanzawa | |
| 8,730,710 B2 | 5/2014 | Baek et al. | |
| 9,117,528 B2 | 8/2015 | Masuoka et al. | |
| 9,496,256 B2 | 11/2016 | Wang et al. | |
| 9,589,643 B2 | 3/2017 | Hwang et al. | |
| 9,620,229 B2 | 4/2017 | Helm et al. | |
| 9,646,688 B2 | 5/2017 | Scheuerlein | |
| 9,721,663 B1 | 8/2017 | Ogawa et al. | |
| 9,941,009 B2 | 4/2018 | Lim et al. | |
| 10,199,326 B1 | 2/2019 | Ohsaki | |
| 10,566,345 B2 | 2/2020 | Kanamori et al. | |
| 10,636,813 B1 | 4/2020 | Xiao | |
| 2014/0085979 A1 | 3/2014 | Kono | |
| 2020/0066744 A1 | 2/2020 | Yun et al. | |
| 2020/0105783 A1 | 4/2020 | Baek | |

FOREIGN PATENT DOCUMENTS

CN    110914988 A    3/2020

*Primary Examiner* — Marvin Payen
(74) *Attorney, Agent, or Firm* — Myers Bigel, P.A.

(57) ABSTRACT

A variable resistance memory device includes lower conductive lines extending in a first direction on a substrate and spaced apart from each other in a second direction crossing the first direction, peripheral transistors on the substrate and arranged under the lower conductive lines in a third direction crossing the first direction and the second direction, and lower contacts electrically connecting the lower conductive lines to the peripheral transistors and extending in the third direction. Each of the lower conductive lines includes a first lower extending portion extending in the first direction, a second lower extending portion offset in the second direction from the first lower extending portion and extending in the first direction, and a lower connecting portion connecting the first lower extending portion to the second lower extending portion. Each of the lower contacts is in the lower connecting portion of a respective one of the lower conductive lines.

20 Claims, 13 Drawing Sheets

VARIABLE RESISTANCE MEMORY DEVICE

CROSS-REFERENCE TO RELATED APPLICATIONS

This application claims priority from Korean Patent Application No. 10-2020-0084603 filed on Jul. 9, 2020 in the Korean Intellectual Property Office, and Korean Patent Application No. 10-2021-0015409, filed on Feb. 3, 2021 in the Korean Intellectual Property Office, the disclosure of which is incorporated herein by reference in its entirety.

FIELD

The present disclosure relates to a semiconductor device, and more specifically, to a variable resistance memory device.

BACKGROUND

Semiconductor memory devices may be broadly grouped into volatile memory devices and nonvolatile memory devices. Volatile memory devices are memory devices in which stored data is deleted when the supply of power is interrupted or stopped, and include, for example, dynamic random access memories (DRAMs), static random access memories (SRAMs), and the like. Nonvolatile memory devices are memory devices in which stored data is not deleted even when the supply of power is interrupted or stopped, and include for example, programmable read-only memories (PROMs), erasable programmable read-only memories (EPROMs), electrically erasable programmable read-only memories (EEPROMs), flash memory devices, and the like.

With the trends of higher performance and lower power consumption of semiconductor memory devices, next-generation semiconductor memory devices such as magnetic random access memories (MRAMs) and phase-change random access memories (PRAMs) are being developed. Materials constituting the next-generation semiconductor memory devices may have characteristics whereby resistance values thereof may vary according to a current or voltage and may be maintained or unchanged change even when the supply of current or voltage is interrupted or stopped.

SUMMARY

Aspects of the present disclosure provide a variable resistance memory device of which a chip size may be more easily reduced.

Aspects of the present disclosure also provide a variable resistance memory device having a simpler interconnection structure.

According to an aspect of the present disclosure, there is provided a variable resistance memory device comprising lower conductive lines extending in a first direction on a substrate and spaced apart from each other in a second direction crossing the first direction; peripheral transistors on the substrate and arranged under the lower conductive lines in a third direction crossing the first direction and the second direction; and lower contacts electrically connecting the lower conductive lines to the peripheral transistors and extending in the third direction, wherein each of the lower conductive lines comprises a first lower extending portion extending in the first direction, a second lower extending portion offset in the second direction from the first lower extending portion and extending in the first direction, and a lower connecting portion that couples the first lower extending portion to the second lower extending portion, and wherein each of the lower contacts is on the lower connecting portion of a respective one of the lower conductive lines.

According to another aspect of the present disclosure, there is provided a variable resistance memory device comprising a peripheral circuit unit on a substrate and comprising peripheral transistors; and a first cell stack and a second cell stack sequentially stacked on the peripheral circuit unit in a first direction, wherein the first cell stack comprises a first lower conductive line including a first lower extending portion that extends in a second direction crossing the first direction, a second lower extending portion that is offset in a third direction crossing the first direction and the second direction from the first lower extending portion and extends in the second direction, and a first lower connecting portion that couples the first lower extending portion to the second lower extending portion, and a first lower contact that electrically connects the first lower conductive line to at least one of the peripheral transistors and extends in the first direction, wherein the first lower contact is on the first lower connecting portion.

According to another aspect of the present disclosure, there is provided a variable resistance memory device comprising
a peripheral circuit unit on a substrate and comprising peripheral transistors; and a first cell stack and a second cell stack sequentially stacked on the peripheral circuit unit in a first direction. The first cell stack comprises a first lower conductive line including a first lower extending portion that extends in a second direction crossing the first direction, a second lower extending portion that is offset in a third direction crossing the first direction and the second direction from the first lower extending portion and extends in the second direction, and a first lower connecting portion that couples the first lower extending portion to the second lower extending portion; a first lower contact that electrically connects the first lower conductive line to at least one of the peripheral transistors and extends in the first direction; a first upper conductive line comprising a first upper extending portion that extends in the third direction, a second upper extending portion that is offset in the second direction from the first upper extending portion and extends in the third direction, and a first upper connecting portion that couples the first upper extending portion to the second upper extending portion; and a first upper contact that electrically connects the first upper conductive line to at least one of the peripheral transistors and extends in the first direction, wherein the first lower contact is on the first lower connecting portion, and the first upper contact is on the first upper connecting portion.

The scope of the present disclosure is not limited to the above-described objects and other unmentioned objects may be clearly understood by those skilled in the art from the following descriptions.

BRIEF DESCRIPTION OF THE DRAWINGS

The above and other aspects and features of the present disclosure will become more apparent by describing example embodiments thereof in detail with reference to the attached drawings, in which.

DETAILED DESCRIPTION OF EMBODIMENTS

Figure 1:
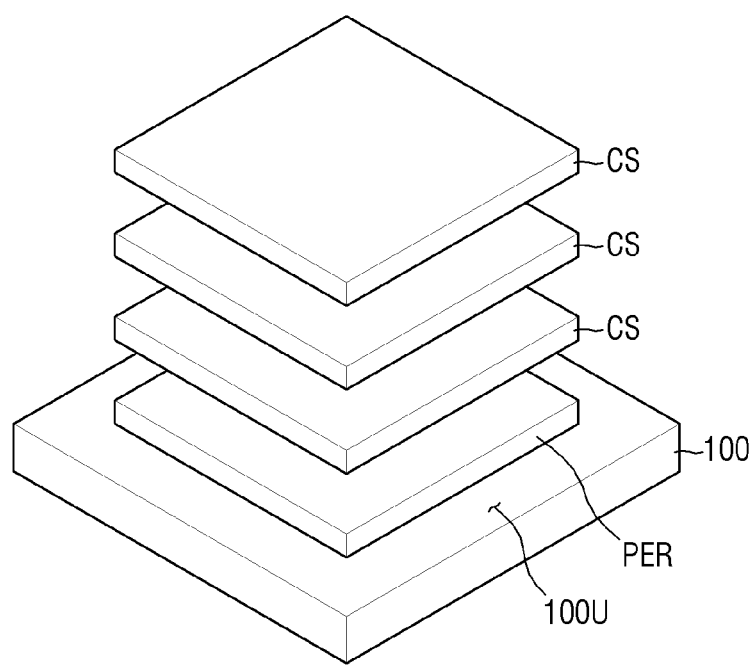
FIG. 1 is an example perspective view of a variable resistance memory device according to some embodiments.
Figure 2:
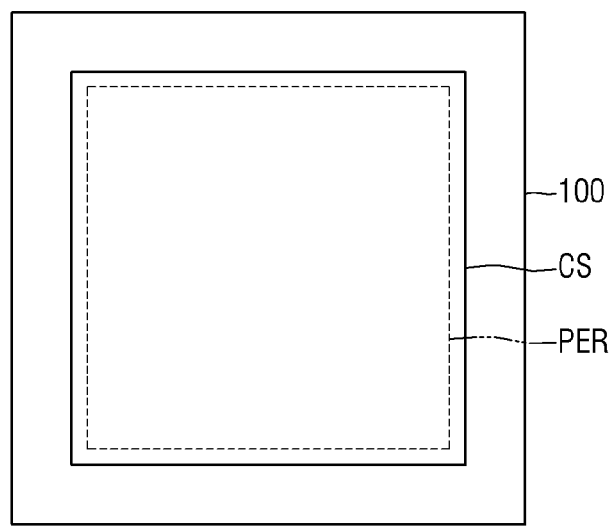
FIG. 2 is an example plan view of the variable resistance memory device of FIG. 1.
Figure 3:
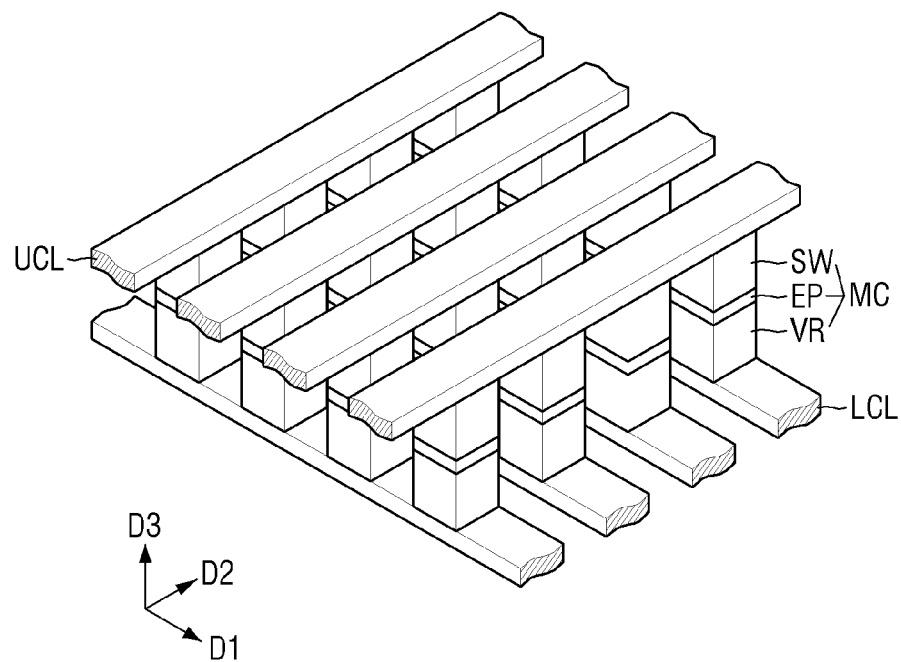
FIG. 3 is an example perspective view illustrating each cell stack of FIG. 1.

FIG. 1 is an example perspective view of a variable resistance memory device according to some embodiments. FIG. 2 is an example plan view of the variable resistance memory device of FIG. 1. FIG. 3 is an example perspective view illustrating each cell stack of FIG. 1.

Referring to FIGS. 1 and 2, a variable resistance memory device 1000 may include a peripheral circuit unit PER disposed on a substrate 100 and a plurality of cell stacks CS sequentially stacked on the peripheral circuit unit PER. In FIG. 1, three cell stacks CS are illustrated, but the concepts of the present disclosure are not limited thereto. The peripheral circuit unit PER may be disposed between a lowermost cell stack CS of the plurality of cell stacks CS and the substrate 100. The peripheral circuit unit PER may vertically overlap the plurality of cell stacks CS (e.g., as shown with reference to direction D3) and may be locally positioned below or under the plurality of cell stacks CS.

Referring to FIG. 3, each of the cell stacks CS may include lower conductive lines LCL which extend in a first direction D1, upper conductive lines UCL which cross the lower conductive lines LCL and extend in a second direction D2, and memory cells MC which are disposed between the lower conductive lines LCL and the upper conductive lines UCL and extend in a third direction D3. The terms first, second, third, etc., are used herein merely to distinguish one element from another. The lower conductive lines LCL may extend in the first direction D1 and be spaced apart from each other in the second direction D2 crossing the first direction D1. The upper conductive lines UCL may be spaced apart from the lower conductive lines LCL in the third (e.g., vertical) direction D3 perpendicular to the first direction D1 and the second direction D2. The upper conductive lines UCL may extend in the second direction D2 and be spaced apart from each other in the first direction D1. The first direction D1 and the second direction D2 may be parallel to an upper surface 100U of the substrate 100 of FIG. 1 and the third direction D3 may be perpendicular to the upper surface 100U of the substrate 100. The lower conductive lines LCL and the upper conductive lines UCL may include a metal (e.g., copper, tungsten, or aluminum) and/or a metal nitride (e.g., tantalum nitride, titanium nitride, or tungsten nitride).

The memory cells MC may each be disposed at a respective intersection of the lower conductive lines LCL and the upper conductive lines UCL. The memory cells MC may be two-dimensionally arranged in the first direction D1 and the second direction D2. Each of the memory cells MC may include a variable resistance pattern VR and a switching pattern SW. The variable resistance pattern VR and the switching pattern SW may be stacked in the third direction D3 between a pair of conductive lines LCL and UCL connected thereto. The variable resistance pattern VR and the switching pattern SW may be electrically connected in series. For example, the variable resistance pattern VR and the switching pattern SW which are included in each of the memory cells MC may be electrically connected in series between the corresponding lower conductive line LCL and the corresponding upper conductive line UCL. In FIG. 3, the switching pattern SW is illustrated as being disposed above the variable resistance pattern VR (relative to the lower conductive line LCL or substrate 100), but the concepts of the present disclosure are not limited thereto. For example, in contrast to that illustrated in FIG. 3, the variable resistance pattern VR may be disposed above the switching pattern SW.

The variable resistance pattern VR may include a material that is configured to indicate or store information according to a change in resistance. In some embodiments, the variable resistance pattern VR may include a material capable of or configured to provide a reversible phase change between a crystalline component/state and an amorphous component/state according to a temperature. The variable resistance pattern VR may include a compound in which at least one of Te or Se, which are chalcogen elements, and at least one of Ge, Sb, Bi, Pb, Sn, Ag, As, S, Si, In, Ti, Ga, P, O, or C are combined. For example, the variable resistance pattern VR may include at least one of GeSbTe, GeTeAs, SbTeSe, GeTe, SbTe, SeTeSn, GeTeSe, SbSeBi, GeBiTe, GeTeTi, InSe, GaTeSe, or InSbTe. As another example, the variable resistance pattern VR may have a superlattice structure (e.g., a structure in which a GeTe layer and a SbTe layer are repeatedly stacked) in which a layer including Ge and a layer not including Ge are repeatedly stacked. According to other embodiments, the variable resistance pattern VR may include at least one of perovskite compounds or at least one of conductive metal oxides. For example, the variable resistance pattern VR may include at least one of niobium oxide, titanium oxide, nickel oxide, zirconium oxide, vanadium oxide, PCMO ((Pr,Ca)MnO$_3$), strontium-titanium oxide, barium-strontium-titanium oxide, strontium-zirconium oxide, barium-zirconium oxide, or barium-strontium-zirconium oxide. According to other embodiments, the variable resistance pattern VR may have a dual structure of a conductive metal oxide film and a tunnel insulating film or may have a triple structure of a first conductive metal oxide film, a tunnel insulating film, and a second conductive metal oxide film. In this case, the tunnel insulating film may include aluminum oxide, hafnium oxide, or silicon oxide. As another example, the variable resistance pattern VR may be made of various types of materials, such as GeTe, GeSe, GeS, SbSe, SbTe, SbS, SbSe, SnSb, InSe, InSb, AsTe, AlTe, GaSb, AlSb, BiSb, ScSb, Ysb, CeSb, DySb, and NdSb, which are compounds obtained by combining two elements, GeSbSe, AlSbTe, AlSbSe, SiSbSe, SiSbTe, GeSeTe, InGeTe, GeSbTe, GeAsTe, SnSeTe, GeGaSe, BiSbSe, GaSeTe, InGeSb, GaSbSe, GaSbTe, InSbSe, InSbTe, SnSbSe, SnSbTe, ScSbTe, ScSbSe, ScSbS, YSbTe, YSbSe, YSbS, CeSbTe, CeSbSe, CeSbS, DySbTe, DySbSe, DySbS, NdSbTe, NdSbSe, and NdSbS, which are compounds obtained by combining three elements, GeSbTeS, BiSbTeSe, AgInSbTe, GeSbSeTe, GeSnSbTe, SiGeSbTe, SiGeSbSe, SiGeSeTe, BiGeSeTe, BiSiGeSe, BiSiGeTe, GeSbTeBi, GeSbSeBi, GeSbSeIn, GeSbSeGa, GeSbSeAl, GeSbSeTl, GeSbSeSn, GeSbSeZn, GeSbTeIn, GeSbTeGa, GeSbTeAl, GeSbTeTl, GeSbTeSn, GeSbTeZn, ScGeSbTe, ScGeSbSe, ScGeSbS, YGeSbTe, YGeSbSe, YGeSbS, CeGeSbTe, CeGeSbSe, CeGeSbS, DyGeSbTe, DyGeSbSe, DyGeSbS, NdGeSbTe, NdGeSbSe, and NdGeSbS, which are compounds obtained by combining four elements, and InSbTe-AsSe, GeScSbSeTe, GeSbSeTeS, GeScSbSeS, GeScSbTeS, GeScSeTeS, GeScSbSeP, GeScSbTeP, GeSbSeTeP, GeScSbSeIn, GeScSbSeGa, GeScSbSeAl, GeScSbSeTl, GeScSbSeZn, GeScSbSeSn, GeScSbTeIn, GeScSbTeGa, GeSbAsTeAl, GeScSbTeTl, GeScSbTeZn, GeScSbTeSn, GeSbSeTeIn, GeSbSeTeGa, GeSbSeTeAl, GeSbSeTeTl, GeSbSeTeZn, GeSbSeTeSn, GeSbSeSIn, GeSbSeSGa, GeSbSeSAl, GeSbSeالسTl, GeSbSeSZn, GeSbSeSSn, GeSb-TeSIn, GeSbTeSGa, GeSbTeSAl, GeSbTeSTl, GeSbTeSZn, GeSbTeSSn, GeSbSeInGa, GeSbSeInAl, GeSbSeInTl, GeSbSeInZn, GeSbSeInSn, GeSbSeGaAl, GeSbSeGaTl, GeSbSeGaZn, GeSbSeGaSn, GeSbSeAlTl, GeSbSeAlZn, GeSbSeAlSn, GeSbSeTlZn, GeSbSeTlSn, and GeSb-SeZnSn, which are compounds obtained by combining five elements. Further, in order to improve characteristics of the variable resistance pattern VR, the above-described materials may be doped with boron (B), nitrogen (N), silicon (Si), carbon (C), or oxygen (O). In some embodiments, the variable resistance pattern VR may be formed as a plurality of layers.

The switching pattern SW may include, for example, a silicon diode or an oxide diode having a rectifying characteristic. In this case, the switching pattern SW may include a silicon diode in which p-Si and n-Si are bonded or include an oxide diode in which p-NiO$_x$ and n-TiO$_x$ are bonded or p-CuO$_x$ and n-TiO$_x$ are bonded. As another example, the switching pattern SW may include oxides (e.g., ZnO$_x$, MgO$_x$, AlO$_x$, etc.) that cause a reduced current to flow due to a high resistance at a specific voltage or less or an increased current to flow due to a low resistance at the specific voltage or more. As still another example, the switching pattern SW may be an Ovonic threshold switch (OTS) device having a bi-directional characteristic. In this case, the switching pattern SW may include a chalcogenide material in a substantially amorphous state. Here, the substantially amorphous state does not exclude a state in which a grain boundary is locally present or a locally crystallized portion is present in a portion of an object. The chalcogenide material may include a compound in which at least one of Te or Se, which are chalcogen elements, and at least one of Ge, Sb, Bi, Al, Pb, Sn, Ag, As, S, Si, In, Ti, Ga, or P are combined. For example, the chalcogenide material may include at least one of AsTe, AsSe, GeTe, SnTe, GeSe, SnTe, SnSe, ZnTe, AsTeSe, AsTeGe, AsSeGe, AsTeGeSe, AsSeGeSi, AsTeGeSi, AsTeGeS, AsTeGeSiIn, AsTeGeSiP, AsTeGeSiSbS, AsTeGeSiSbP, AsTeGeSeSb, AsTeGeSeSi, SeTeGeSi, GeSbTeSe, GeBiTeSe, GeAsSbSe, GeAsBiTe, or GeAsBiSe. As another example, the switching pattern SW may include an OTS selector including a compound such as GeSe, GeS, AsSe, AsTe, AsS SiTe, SiSe, SiS, GeAs, SiAs, SnSe, SnTe, GeAsTe, GeAsSe, AlAsTe, AlAsSe, SiAsSe, SiAsTe, GeSeTe, GeSeSb, GaAsSe, GaAsTe, InAsSe, InAsTe, SnAsSe, SnAsTe, GeSiAsTe, GeSiAsSe, GeSiSeTe, GeSeTeSb, GeSiSeSb, GeSiTeSb, GeSeTeBi, GeSiSeBi, GeSiTeBi, GeAsSeSb, GeAsTeSb, GeAsTeBi, GeAsSeBi, GeAsSeIn, GeAsSeGa, GeAsSeAl, GeAsSeTl, GeAsSeSn, GeAsSeZn, GeAsTeIn, GeAsTeGa, GeAsTeAl, GeAsTeTl, GeAsTeSn, GeAsTeZn, GeSiAsSeTe, GeAsSeTeS, GeSi-AsSeS, GeSiAsTeS, GeSiSeTeS, GeSiAsSeP, GeSiAsTeP, GeAsSeTeP, GeSiAsSeIn, GeSiAsSeGa, GeSiAsSeAl, GeSiAsSeTl, GeSiAsSeZn, GeSiAsSeSn, GeSiAsTeIn, GeSiAsTeGa, GeSiAsTeAl, GeSiAsTeTl, GeSiAsTeZn, GeSiAsTeSn, GeAsSeTeIn, GeAsSeTeGa, GeAsSeTeAl, GeAsSeTeTl, GeAsSeTeZn, GeAsSeTeSn, GeAsSeSIn, GeAsSeSGa, GeAsSeSAl, GeAsSeSTl, GeAsSeSZn, GeAs-SeSSn, GeAsTeSIn, GeAsTeSGa, GeAsTeSAl, GeAsTeSTl, GeAsTeSZn, GeAsTeSSn, GeAsSeInGa, GeAsSeInAl, GeAsSeInTl, GeAsSeInZn, GeAsSeZnSn, GeAsSeGaAl, GeAsSeGaTl, GeAsSeGaZn, GeAsSeGaSn, GeAsSeAlTl, GeAsSeAlZn, GeAsSEAlSn, GeAsSeTlZn, GeAsSeTlSn, GeAsSeZnSn, GeSiAsSeTeS, GeSiAsSeTeIn, GeSiAs-SeTeGa, GeSiAsSeTeAl, GeSiAsSeTeTl, GeSiAsSeTeZn, GeSiAsSeTeSn, GeSiAsSeTeP, GeSiAsSeSIn, GeSi-AsSeSGa, GeSiAsSeSAl, GeSiAsSeSTl, GeSiAsSeSZn, GeSiAsSeSSn, GeAsSeTeSIn, GeAsSeTeSGa, GeAsSeTe-SAl, GeAsSeTeSTl, GeAsSeTeSZn, GeAsSeTeSSn, GeAs-SeTePIn, GeAsSeTePGa, GeAsSeTePAl, GeAsSeTePTl, GeAsSeTePZn, GeAsSeTePSn, GeSiAsSeInGa, GeSiAs-SeInAl, GeSiAsSeInTl, GeSiAsSeInZn, GeSiAsSeInSn, GeSiAsSeGaAl, GeSiAsSeGaTl, GeSiAsSeGaZn, GeSi-AsSeGaSn, GeSiAsSeAlSn, GeAsSeTeInGa, GeAs-SeTeInAl, GeAsSeTeInTl, GeAsSeTeInZn, GeAsSeTeInSn, GeAsSeTeGaAl, GeAsSeTeGaTl, GeAsSeTeGaZn, GeAs-SeTeGaSn, GeAsSeTeAlSn, GeAsSeSInGa, GeAsSeSInAl, GeAsSeSInTl, GeAsSeSInZn, GeAsSeSInSn, GeAsS-eSGaAl, GeAsSeSGaTl, GeAsSeSGaZn, GeAsSeSGaSn, or GeAsSeSAlSn.

Each of the memory cells MC may further include an electrode layer EP interposed between the variable resistance pattern VR and the switching pattern SW. The electrode layer EP may prevent the variable resistance pattern VR from being in direct contact with the switching pattern SW and may electrically connect the variable resistance pattern VR to the switching pattern SW. As used herein, when elements or layers are directly on, directly connecting, or in direct contact with one another, no intervening elements or layers may be present. The electrode layer EP may include, for example, at least one of W, Ti, Al, Cu, C, CN, TiN, TiAlN, TiSiN, TiCN, WN, CoSiN, WSiN, TaN, TaCN, or TaSiN.

Referring again to FIGS. 1 and 2, the peripheral circuit unit PER may include peripheral circuits for driving the memory cells MC of the plurality of cell stacks CS. The peripheral circuits may be peripheral transistors. The peripheral circuits may include a first decoder circuit connected to the lower conductive lines LCL of the plurality of cell stacks CS, a second decoder circuit connected to the upper conductive lines UCL of the plurality of cell stacks CS, and an input/output (I/O) sense amplifier connected to the lower conductive lines LCL or the upper conductive lines UCL.

Figure 4:
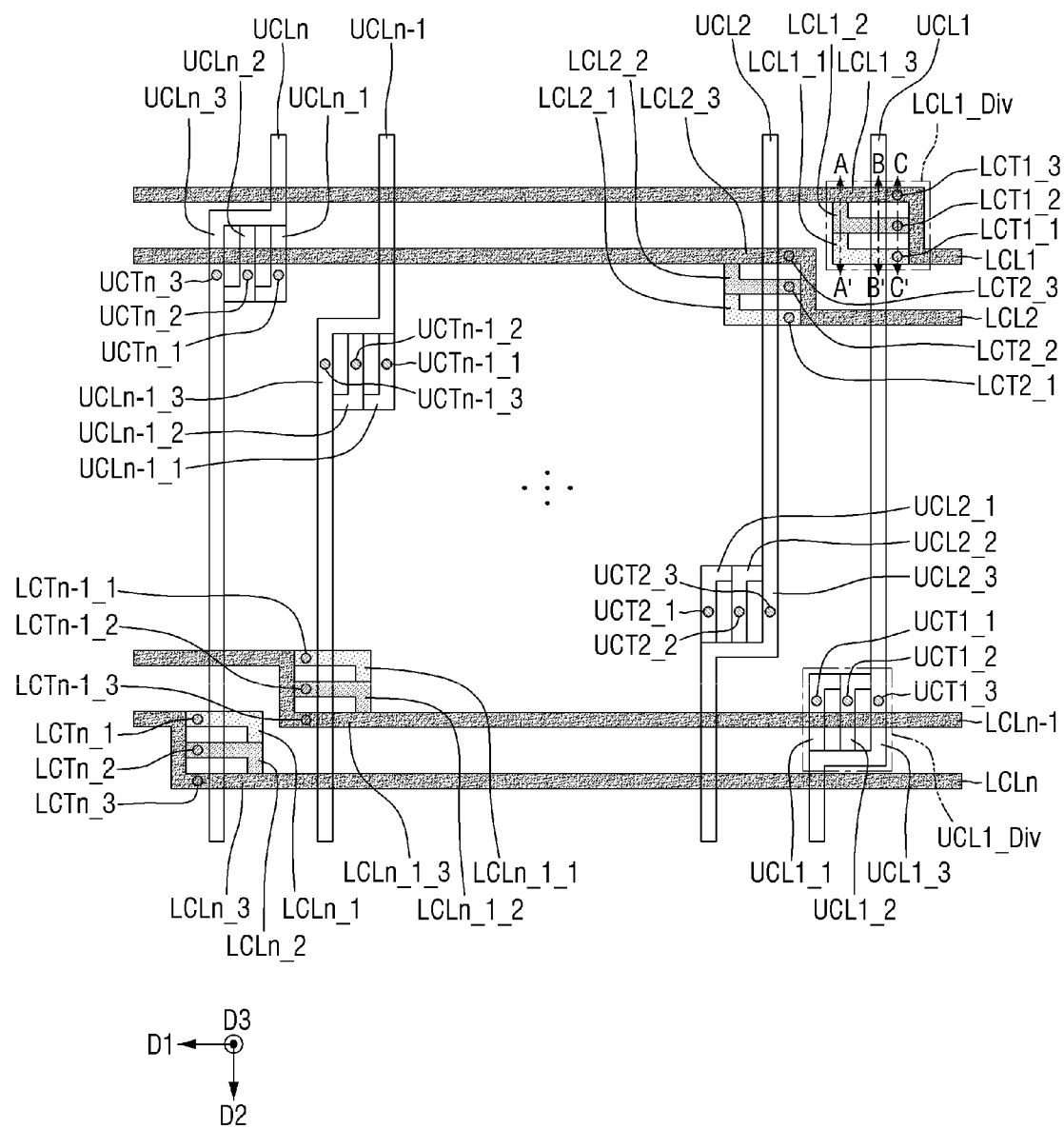
FIG. 4 is a layout diagram of a variable resistance memory device according to some embodiments.
Figure 5:
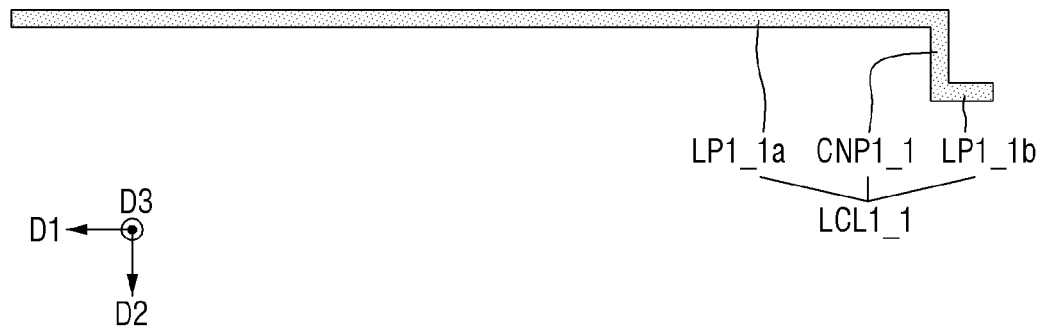
FIG. 5 is an example view illustrating a conductive line of the variable resistance memory device according to some embodiments.
Figure 6:
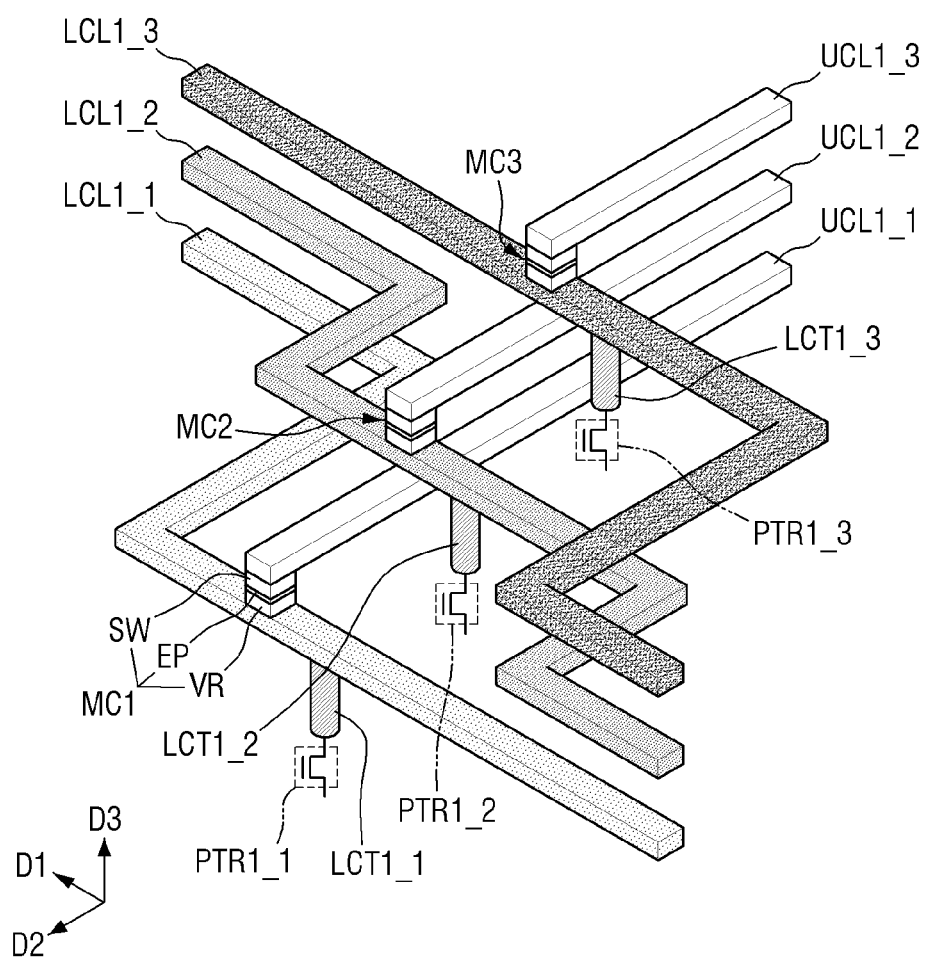
FIGS. 6 and 7 are example perspective views illustrating a portion of the variable resistance memory device according to some embodiments.
Figure 7:
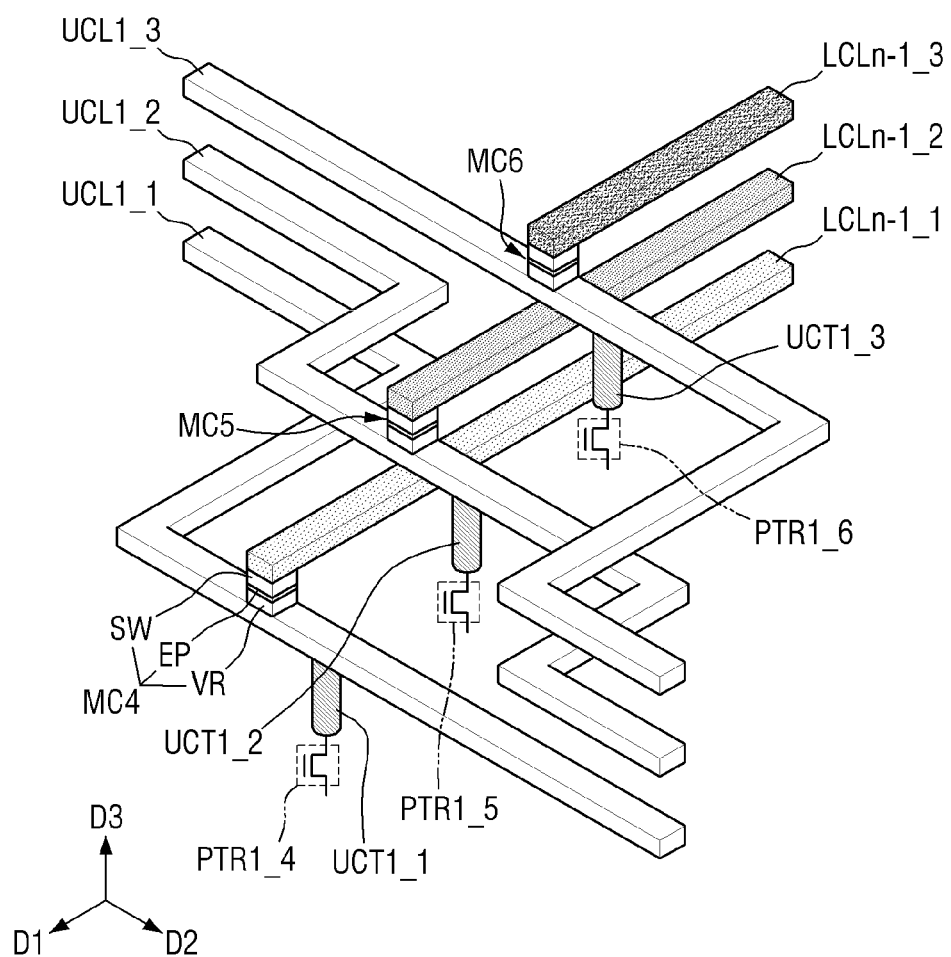

FIG. 4 is a layout diagram of a variable resistance memory device according to some embodiments. FIG. 5 is an example view illustrating a conductive line of the variable resistance memory device according to some embodiments. FIGS. 6 and 7 are example perspective views illustrating a portion of the variable resistance memory device according to some embodiments.

Referring to FIG. 4, in the variable resistance memory device according to some embodiments, lower conductive lines LCL1 to LCLn, upper conductive lines UCL1 to UCLn, lower contacts LCT which electrically connect the lower conductive lines LCL1 to LCLn to peripheral transistors, and upper contacts UCT which electrically connect the upper conductive lines UCL1 to UCLn to the peripheral transistors are disposed.

Each of the lower conductive lines LCL1 to LCLn may include a plurality of lower conductive lines (also referred to herein as sublines) formed in each of the plurality of cell stacks CS of FIG. 1. For example, a first lower conductive line LCL1 may include a $1^{st}\_1$ (e.g., a first) lower conductive line LCL1_1 formed in a first cell stack, a $1^{st}\_2$ (e.g., a second) lower conductive line LCL1_2 formed in a second cell stack formed in a third direction D3 of the first cell stack, and a $1^{st}\_3$ (e.g., a third) lower conductive line LCL1_3 formed in a third cell stack formed in the third direction D3 of the second cell stack. As another example, a second lower conductive line LCL2 may include a $2^{nd}\_1$ (e.g., a first) lower conductive line LCL2_1 formed in the first cell stack, a $2^{nd}\_2$ (e.g., a second) lower conductive line LCL2_2 formed in the second cell stack formed in the third direction D3 of the first cell stack, and a $2^{nd}\_3$ (e.g., a third) lower conductive line LCL2_3 formed in the third cell stack formed in the third direction D3 of the second cell stack. As still another example, an $(n-1)^{th}$ lower conductive line LCLn-1 may include an $(n-1)^{th}\_1$ (e.g., a first) lower conductive line LCLn-1_1 formed in the first cell stack, an $(n-1)^{th}\_2$ (e.g., a second) lower conductive line LCLn-1_2 formed in the second cell stack formed in the third direction D3 of the first cell stack, and an $(n-1)^{th}\_3$ (e.g., a third) lower conductive line LCLn-1_3 formed in the third cell stack formed in the third direction D3 of the second cell stack. As yet another example, an $n^{th}$ lower conductive line LCLn may include an $n^{th}\_1$ (e.g., a first) lower conductive line LCLn_1 formed in the first cell stack, an $n^{th}\_2$ (e.g., a second) lower conductive line LCLn_2 formed in the second cell stack formed in the third direction D3 of the first cell stack, and an $n^{th}\_3$ (e.g., a third) lower conductive line LCLn_3 formed in the third cell stack formed in the third direction D3 of the second cell stack.

Further, each of the upper conductive lines UCL1 to UCLn may include a plurality of upper conductive lines (also referred to herein as sublines), each of which is formed in one of the plurality of cell stacks CS of FIG. 1. For example, a first upper conductive line UCL1 may include a $1^{st}\_1$ (e.g., a first) upper conductive line UCL1_1 formed in the first cell stack, a $1^{st}\_2$ (e.g., a second) upper conductive line UCL1_2 formed in the second cell stack formed in the third direction D3 of the first cell stack, and a $1^{st}\_3$ (e.g., a third) upper conductive line UCL1_3 formed in the third cell stack formed in the third direction D3 of the second cell stack. As yet another example, a second upper conductive line UCL2 may include a $2^{nd}\_1$ (e.g., a first) upper conductive line UCL2_1 formed in the first cell stack, a $2^{nd}\_2$ (e.g., a second) upper conductive line UCL2_2 formed in the second cell stack formed in the third direction D3 of the first cell stack, and a $2^{nd}\_3$ (e.g., a third) upper conductive line UCL2_3 formed in the third cell stack formed in the third direction D3 of the second cell stack. As yet another example, an $(n-1)^{th}$ upper conductive line UCLn-1 may include an $(n-1)^{th}\_1$ (e.g., a first) upper conductive line UCLn-1_1 formed in the first cell stack, an $(n-1)^{th}\_2$ (e.g., a second) upper conductive line UCLn-1_2 formed in the second cell stack formed in the third direction D3 of the first cell stack, and an $(n-1)^{th}\_3$ (e.g., a third) upper conductive line UCLn-1_3 formed in the third cell stack formed in the third direction D3 of the second cell stack. As yet another example, an $n^{th}$ upper conductive line UCLn may include an $n^{th}\_1$ (e.g., a first) upper conductive line UCLn_1 formed in the first cell stack, an $n^{th}\_2$ (e.g., a second) upper conductive line UCLn_2 formed in the second cell stack formed in the third direction D3 of the first cell stack, and an $n^{th}\_3$ (e.g., a third) upper conductive line UCLn_3 formed in the third cell stack formed in the third direction D3 of the second cell stack.

In the variable resistance memory device according to some embodiments, the number of layers (also referred to herein as sublayers) of the conductive lines UCL, LCL is not limited to the three layers described above and may be formed as two layers, four layers, or m layers (where m may be a natural number of 5 or more).

When viewed from the third direction D3, the plurality of layers included in each conductive line UCL, LCL may include a region in which the plurality of layers overlap each other and extend, a branch region (e.g., a first lower conductive line branch region LCL1_Div or a first upper conductive line branch region UCL1_Div) which branches off from the region in which the plurality of layers overlap each other and extend, and a region in which the plurality of layers overlap each other again and extend.

For description of the above-described configuration, an example of the $1^{st}\_1$ lower conductive line LCL_1 formed in a first layer (or the first stack) among the conductive lines forming the first lower conductive line LCL1 will be described with reference to FIG. 5. A description of the $1^{st}\_1$ lower conductive line LCL1_1 to be described in FIG. 5 below may be applied to other conductive lines of the variable resistance memory device according to some embodiments.

Referring to FIGS. 4 and 5, the first lower conductive line LCL1 may be formed as a plurality of layers. The $1^{st}\_1$ lower conductive line LCL1_1 formed in the first layer (or the first stack) among the plurality of layers forming the first lower conductive line LCL1 includes a $1^{st}\_1a$ lower extending portion LP1_1a which extends in a first direction D1, a $1^{st}\_1b$ lower extending portion LP1_1b which is offset in a second direction D2 from the $1^{st}\_1a$ lower extending portion LP1_1a and extends in the first direction D1, and a $1^{st}\_1$ lower connecting portion CNP1_1 which connects (or "couples") the $1^{st}\_1a$ lower extending portion LP1_1a to the $1^{st}\_1b$ lower extending portion LP1_1b.

That is, each of the $1^{st}\_1$ lower conductive line LCL1_1, the $1^{st}\_2$ lower conductive line LCL1_2, and the $1^{st}\_3$ lower conductive line LCL1_3 of each layer forming the first lower conductive line LCL1 includes extending portions, which are disposed in parallel to be spaced apart from each other in a third direction D3, and lower connecting portions which branch off from the first lower conductive line branch region LC1_Div.

When viewed from the third direction D3, in the variable resistance memory device according to some embodiments, lower contacts LCT1_1 to LCT1_3 may be disposed on the lower conductive lines LCL1_1 to LCL1_3, respectively, so as not to overlap each other in the branch region (e.g., the first lower conductive line branch region LCL1_Div) in the vertical direction D3.

More specifically, in order to respectively electrically connect the lower conductive lines LCL1_1 to LCL1_3 to the peripheral transistors formed in the peripheral circuit unit PER, the lower contacts LCT1_1 to LCT1_3 may be connected to the lower conductive lines LCL1_1 to LCL1_3, respectively. In this case, when viewed from the third direction D3, in the variable resistance memory device according to some embodiments, in order to prevent electrical connection of the lower contacts LCT1_1 to LCT1_3, the lower contacts LCT1_1 to LCT1_3 may be disposed so as not to overlap each other in the first lower conductive line branch region LCL1_Div in the vertical direction D3.

The above configuration will be described in detail with reference to perspective views of FIGS. 6 and 7.

Referring to FIGS. 4 and 6, when viewed from the third direction D3, the $1^{st}\_1$ lower contact LCT1_1, which electrically connects the $1^{st}\_1$ lower conductive line LCL1_1 to a $1^{st}\_1$ peripheral transistor PTR1_1, may be formed in a portion of the $1^{st}\_1$ lower conductive line LCL1_1 in the first lower conductive line branch region LCL1_Div in which portions of the $1^{st}\_1$ lower conductive line LCL1_1, the $1^{st}\_2$ lower conductive line LCL1_2, and the $1^{st}\_3$ lower conductive line LCL1_3 do not overlap each other. As yet another example, when viewed from the third direction D3, the $1^{st}\_2$ lower contact LCT1_2, which electrically connects the $1^{st}\_2$ lower conductive line LCL1_2 to a $1^{st}\_2$ peripheral transistor PTR1_2, may be formed in a portion of the $1^{st}\_2$ lower conductive line LCL1_2 in the first lower conductive line branch region LCL1_Div in which portions of the $1^{st}\_1$ lower conductive line LCL1_1, the $1^{st}\_2$ lower conductive line LCL1_2, and the $1^{st}\_3$ lower conductive line LCL1_3 do not overlap each other. As yet another example, when viewed from the third direction D3, the $1^{st}\_3$ lower contact LCT1_3, which electrically connects the $1^{st}\_3$ lower conductive line LCL1_3 to the $1^{st}\_3$ peripheral transistor PTR1_3, may be formed in a portion of the $1^{st}\_3$ lower conductive line LCL1_3 in the first lower conductive line branch region LCL1_Div in which portions of the $1^{st}\_1$ lower conductive line LCL1_1, the $1^{st}\_2$ lower conductive line LCL1_2, and the $1^{st}\_3$ lower conductive line LCL1_3 do not overlap each other.

The above description may also be similarly applicable to the upper conductive lines UCL1 to UCLn including the branch region (e.g., the first upper conductive line branch region UCL1_Div). The above configuration will be described with reference to FIG. 7 using an example of the first upper conductive line UCL1.

Referring to FIGS. 4 and 7, when viewed from the third direction D3, the $1^{st}\_1$ upper contact UCT1_1, which electrically connects the $1^{st}\_1$ upper conductive line UCL1_1 to the $1^{st}\_1$ peripheral transistor PTR1_4, may be formed in a portion of the $1^{st}\_1$ upper conductive line UCL1_1 in the first upper conductive line branch region UCL1_Div in which portions of the $1^{st}\_1$ upper conductive line UCL1_1, the $1^{st}\_2$ upper conductive line UCL1_2, and the $1^{st}\_3$ upper conductive line UCL1_3 do not overlap each other. As yet another example, when viewed from the third direction D3, the $1^{st}\_2$ upper contact UCT1_2, which electrically connects the $1^{st}\_2$ upper conductive line UCL1_2 to the $1^{st}\_2$ peripheral transistor PTR1_5, may be formed in a portion of the $1^{st}\_2$ upper conductive line UCL1_2 in the first upper conductive line branch region UCL1_Div in which portions of the $1^{st}\_1$ upper conductive line UCL1_1, the $1^{st}\_2$ upper conductive line UCL1_2, and the $1^{st}\_3$ upper conductive line UCL1_3 do not overlap each other. As yet another example, when viewed from the third direction D3, the $1^{st}\_3$ upper contact UCT1_3, which electrically connects the $1^{st}\_3$ upper conductive line UCL1_3 to the $1^{st}\_3$ peripheral transistor PTR1_6, may be formed in a portion of the $1^{st}\_3$ upper conductive line UCL1_3 in the first upper conductive line branch region UCL1_Div in which portions of the $1^{st}\_1$ upper conductive line UCL1_1, the $1^{st}\_2$ upper conductive line UCL1_2, and the $1^{st}\_3$ upper conductive line UCL1_3 do not overlap each other.

That is, in the variable resistance memory device according to some embodiments, each of the conductive lines UCLx, LCLx having the plurality of layers or conductive sublines UCLx_x, LCLx_x includes the branch region UCLx_Div, LCLx_Div in which peripheral transistors PTR are directly connected to vertically non-overlapping portions of the sublines UCLx_x, LCLx_x by respective contacts UCT, LCT extending therebetween, and thus a size of a semiconductor chip including the variable resistance memory device according to some embodiments may be reduced due to a relatively simple interconnection structure.

Figure 8:
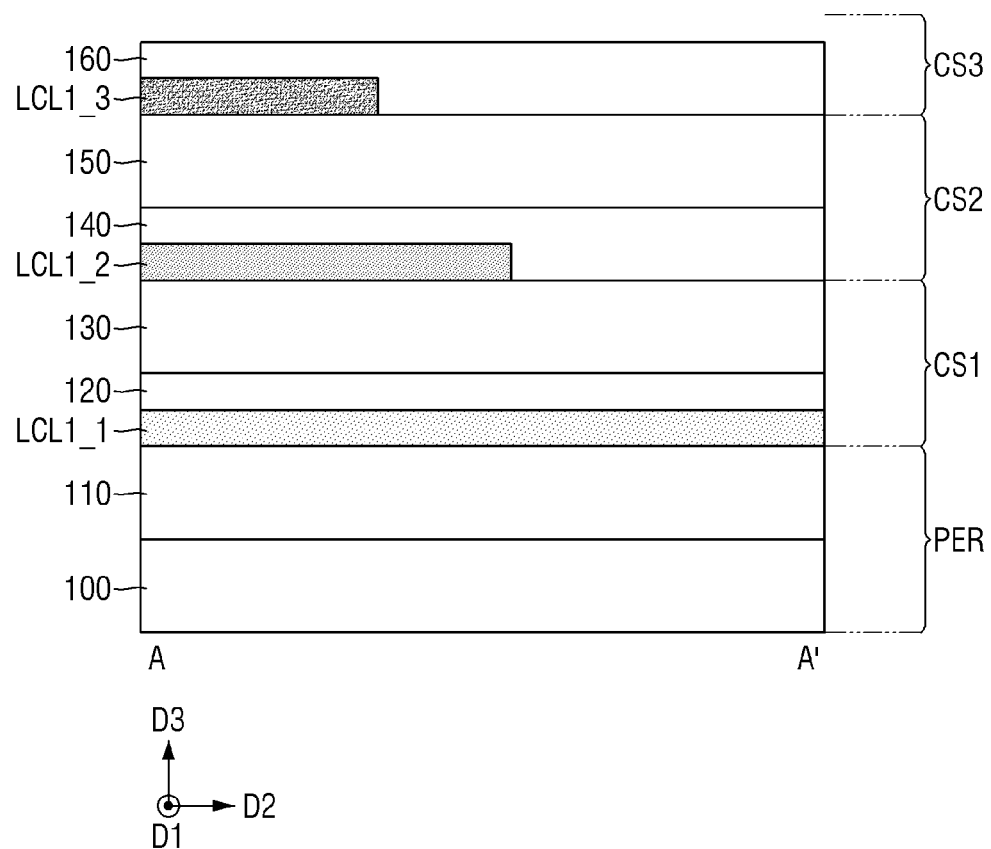
FIG. 8 is a cross-sectional view taken along line A-A' of FIG. 4.
Figure 9:
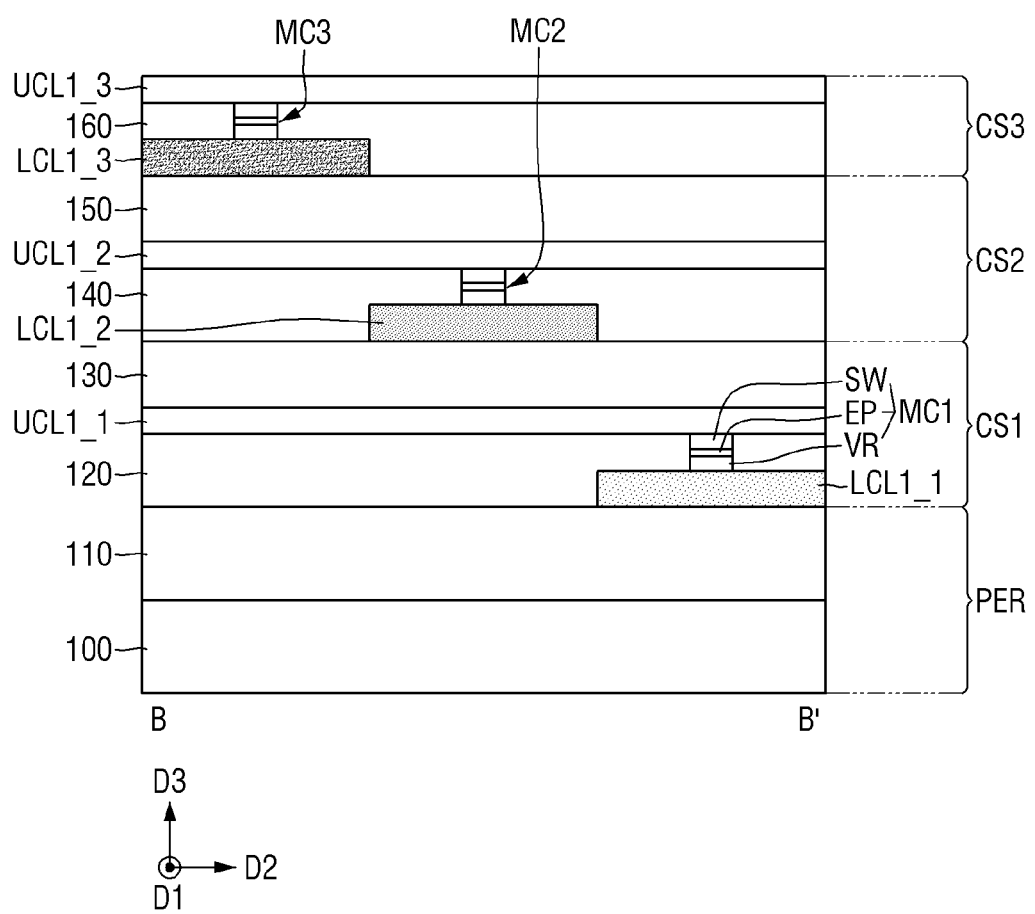
FIG. 9 is a cross-sectional view taken along line B-B' of FIG. 4.
Figure 10:
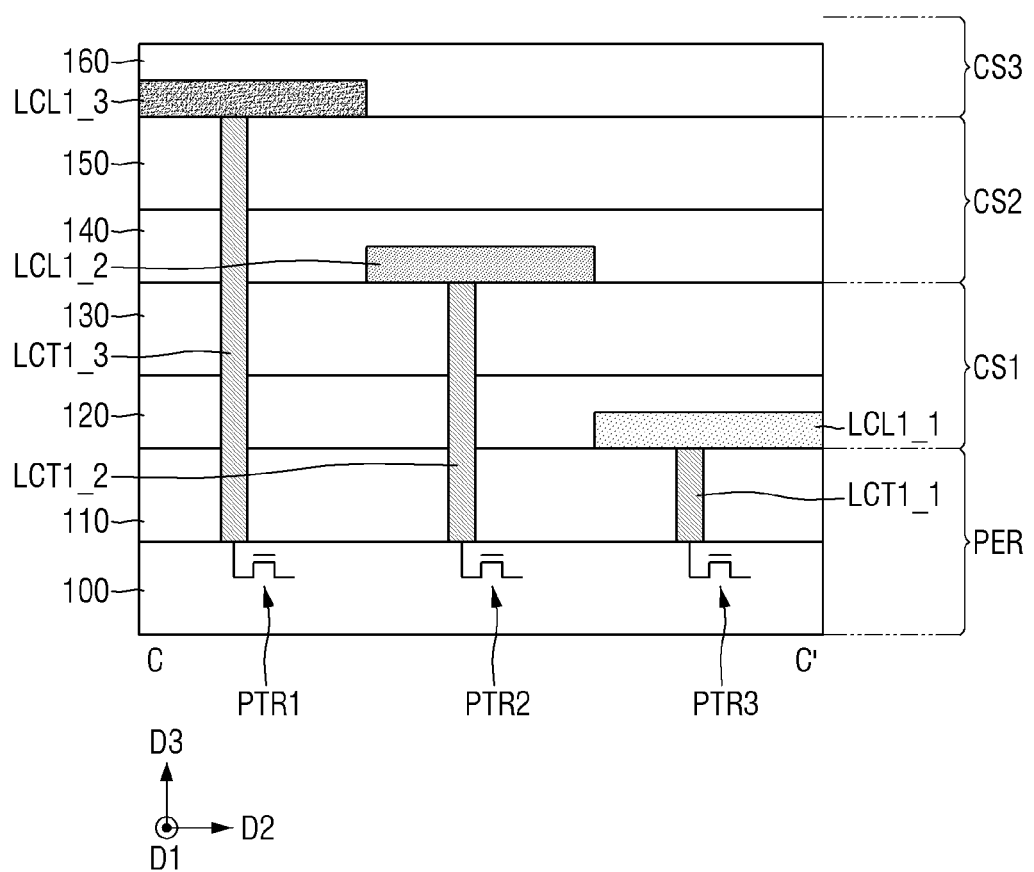
FIG. 10 is a cross-sectional view taken along line C-C' of FIG. 4.

FIG. 8 is a cross-sectional view taken along line A-A' of FIG. 4. FIG. 9 is a cross-sectional view taken along line B-B' of FIG. 4. FIG. 10 is a cross-sectional view taken along line C-C' of FIG. 4.

Referring to FIGS. 8 to 10, a peripheral circuit unit PER may be disposed on a substrate 100. The peripheral circuit unit PER may include peripheral transistors PTR and a first interlayer insulating film 110 which covers the peripheral transistors PTR. The first interlayer insulating film 110 may include, for example, an oxide, a nitride, and/or an oxynitride. A first cell stack CS1, a second cell stack CS2, and a third cell stack CS3 may be sequentially stacked on the peripheral circuit unit PER. The peripheral transistors PTR may vertically overlap the first to third cell stacks CS1, CS2, and CS3 and may be locally disposed below the first to third cell stacks CS1, CS2, and CS3. The peripheral transistors PTR may constitute peripheral circuits for driving memory cells MC of the first to third cell stacks CS1, CS2, and CS3.

The peripheral transistors PTR may be three-dimensional (3D) transistors. An example in which the peripheral transistors PTR are three-dimensionally formed will be described with reference to FIG. 11.

Figure 11:
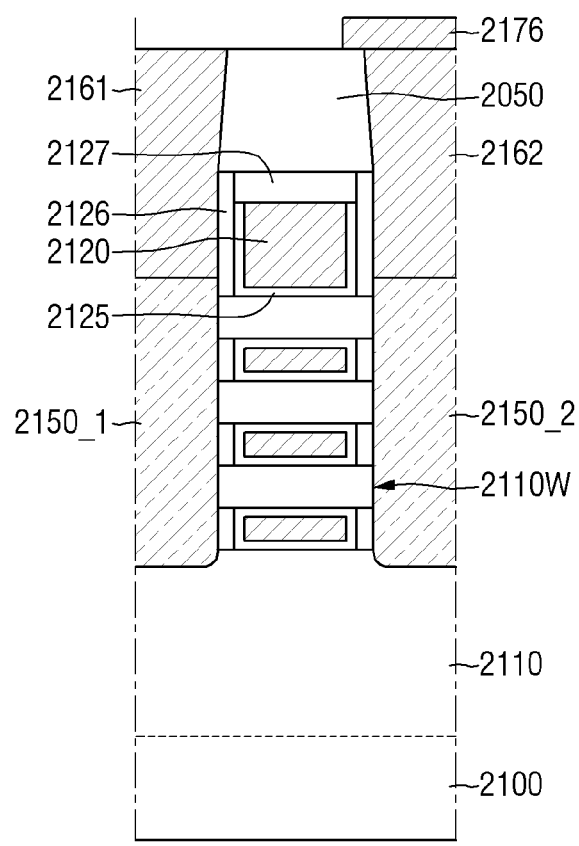
FIG. 11 is an example cross-sectional view illustrating a peripheral transistor of FIG. 7.

FIG. 11 is an example cross-sectional view illustrating a peripheral transistor of FIG. 7.

Referring to FIG. 11, the peripheral transistors PTR of the variable resistance memory device according to some embodiments are illustrated as including 3D transistors, in particular, gate all-around transistors (GAA FETs) including a nanowire-shaped or nanosheet-shaped channel region, but the present disclosure is not limited thereto. The peripheral transistors PTR according to some embodiments of the present disclosure may include tunneling transistors (tunneling FETs), transistors using a fin-shaped pattern as a channel, or 3D transistors.

The peripheral transistor PTR of the variable resistance memory device according to some embodiments may include a fin-shaped pattern 2110 and a gate pattern 2120.

A substrate 2100 may be formed of bulk silicon or a silicon-on-insulator (SOI). Alternatively, the substrate 2100 may be a silicon substrate or may include other materials, for example, silicon germanium, silicon germanium on insulator (SGOI), indium antimonide, a lead tellurium compound, indium arsenic, indium phosphide, gallium arsenic, or gallium antimonide, but the present disclosure is not limited thereto. The substrate 2100 may correspond to the substrate 100 of FIG. 1.

The fin-shaped pattern 2110 may protrude from the substrate 2100. The fin-shaped pattern 2110 may be formed by etching a portion of the substrate 2100 or may include an epitaxial layer grown from the substrate 2100. The fin-shaped pattern 2110 may include silicon or germanium as an element semiconductor material. Further, each fin-shaped pattern 2110 may include a compound semiconductor and may include, for example, a IV-IV group compound semiconductor or a III-V group compound semiconductor. The IV-IV group compound semiconductor may be, for example, a binary compound or a ternary compound including at least two of carbon (C), silicon (Si), germanium (Ge), or tin (Sn), or may be a compound in which the binary compound or the ternary compound is doped with a IV group element. The III-V group compound semiconductor may be, for example, one of a binary compound, a ternary compound, or a quaternary compound formed by bonding at least one of aluminum (Al), gallium (Ga), or indium (In), which are III group elements, and one of phosphorus (P), arsenic (As), or antimonium (Sb) which are V group elements.

The gate pattern 2120 may extend to be perpendicular to the substrate 2100 and may be long. The gate pattern 2120 may include at least one of a metal, a conductive metal nitride, a metal silicide, a doped semiconductor material, or a conductive metal oxynitride.

A gate insulating film 2125 may surround a nanosheet 2110W. The gate insulating film 2125 may include at least one of silicon oxide, silicon oxynitride, silicon nitride, or a high-k material having a higher dielectric constant than silicon oxide.

A gate spacer 2126 may be disposed on sidewalls of each gate pattern 2120. The gate spacer 2126 may include an insulating material.

A capping pattern 2127 may be disposed on an upper surface of each gate pattern 2120. The capping pattern 2127 may include an insulating material.

In some embodiments, the capping pattern 2127 may be omitted.

A plurality of semiconductor patterns 2150_1 and 2150_2 may be disposed on the fin-shaped pattern 2110. Each of the plurality of semiconductor patterns 2150_1 and 2150_2 may be connected to a nanosheet 2110W adjacent thereto.

An interlayer insulating film 2050 may cover the gate pattern 2120.

An interconnection structure may be formed in the interlayer insulating film 2050 or formed on the interlayer insulating film 2050. The interconnection structure may include a plurality of contacts 2161 and 2162. The plurality of contacts 2161 and 2162 may be, for example, the plurality of lower contacts LCT and/or the plurality of upper contacts UCT of FIG. 4.

The plurality of contacts 2161 and 2162 may be connected to the plurality of semiconductor patterns 2150_1 and 2150_2, respectively.

A connection line 2176 may be formed on the interlayer insulating film 2050 and may electrically connect two or more different contacts.

Referring again to FIGS. 8 to 10, the first cell stack CS1 may include the $1^{st}\_1$ lower conductive lines LCL1_1, the $1^{st}\_1$ upper conductive lines UCL1_1 crossing the $1^{st}\_1$ lower conductive lines LCL1_1, and first memory cells MC1 disposed between the $1^{st}\_1$ lower conductive lines LCL1_1 and the $1^{st}\_1$ upper conductive lines UCL1_1. The $1^{st}\_1$ lower conductive lines LCL1_1 may be disposed on the first interlayer insulating film 110. The $1^{st}\_1$ lower conductive lines LCL1_1 may extend in the first direction D1 and be spaced apart from each other in the second direction D2. The $1^{st}\_1$ upper conductive lines UCL1_1 may be vertically spaced apart from the $1^{st}\_1$ lower conductive lines LCL1_1 in the third direction D3. The $1^{st}\_1$ upper conductive lines UCL1_1 may extend in the second direction D2 and be spaced apart from each other in the first direction D1. The $1^{st}\_1$ lower conductive lines LCL1_1 and the $1^{st}\_1$ upper conductive lines UCL1_1 may include a metal (e.g., copper, tungsten, or aluminum) and/or a metal nitride (e.g., tantalum nitride, titanium nitride, or tungsten nitride). The first memory cells MC1 may be disposed at intersections of the $1^{st}\_1$ lower conductive lines LCL1_1 and the $1^{st}\_1$ upper conductive lines UCL1_1. Each of the first memory cells MC1 may include the variable resistance pattern VR, the switching pattern SW, and the electrode layer EP disposed between the variable resistance pattern VR and the switching pattern SW, which are described with reference to FIG. 3.

The first cell stack CS1 may include a second interlayer insulating film 120 and a third interlayer insulating film 130 which are sequentially stacked on the first interlayer insulating film 110. The second interlayer insulating film 120 may cover the $1^{st}\_1$ lower conductive lines LCL1_1 and cover side surfaces of the first memory cells MC1. The $1^{st}\_1$ upper conductive lines UCL1_1 may be disposed on the second interlayer insulating film 120. The third interlayer insulating film 130 may be disposed on the second interlayer insulating film 120 to cover the $1^{st}\_1$ upper conductive lines UCL1_1. The second and third interlayer insulating films 120 and 130 may include, for example, an oxide, a nitride, and/or an oxynitride.

The first cell stack CS1 may include the $1^{st}\_1$ lower contacts LCT1_1, each of which is connected to one of the $1^{st}\_1$ lower conductive lines LCL1_1. Each of the $1^{st}\_1$ lower contacts LCT1_1 may vertically extend from a bottom surface of each of the $1^{st}\_1$ lower conductive lines LCL1_1 toward the substrate 100. Each of the $1^{st}\_1$ lower contacts LCT1_1 may pass through the first interlayer insulating film 110 and be connected to one terminal of a corresponding peripheral transistor PTR3 among the peripheral transistors PTR1 to PTR3.

Figure 12:
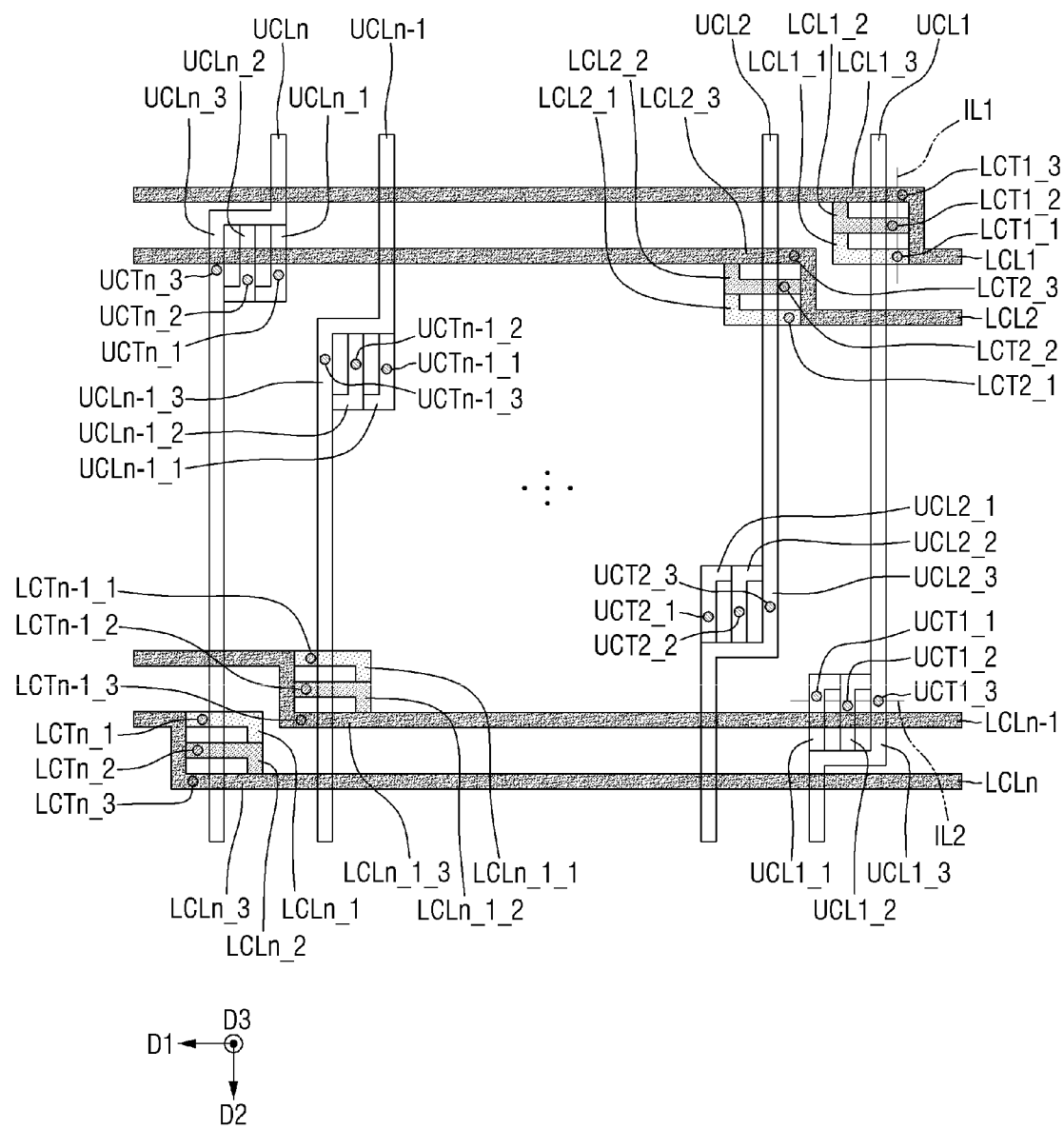
FIGS. 12 and 13 are layout diagrams of other variable resistance memory devices according to some embodiments.
Figure 13:
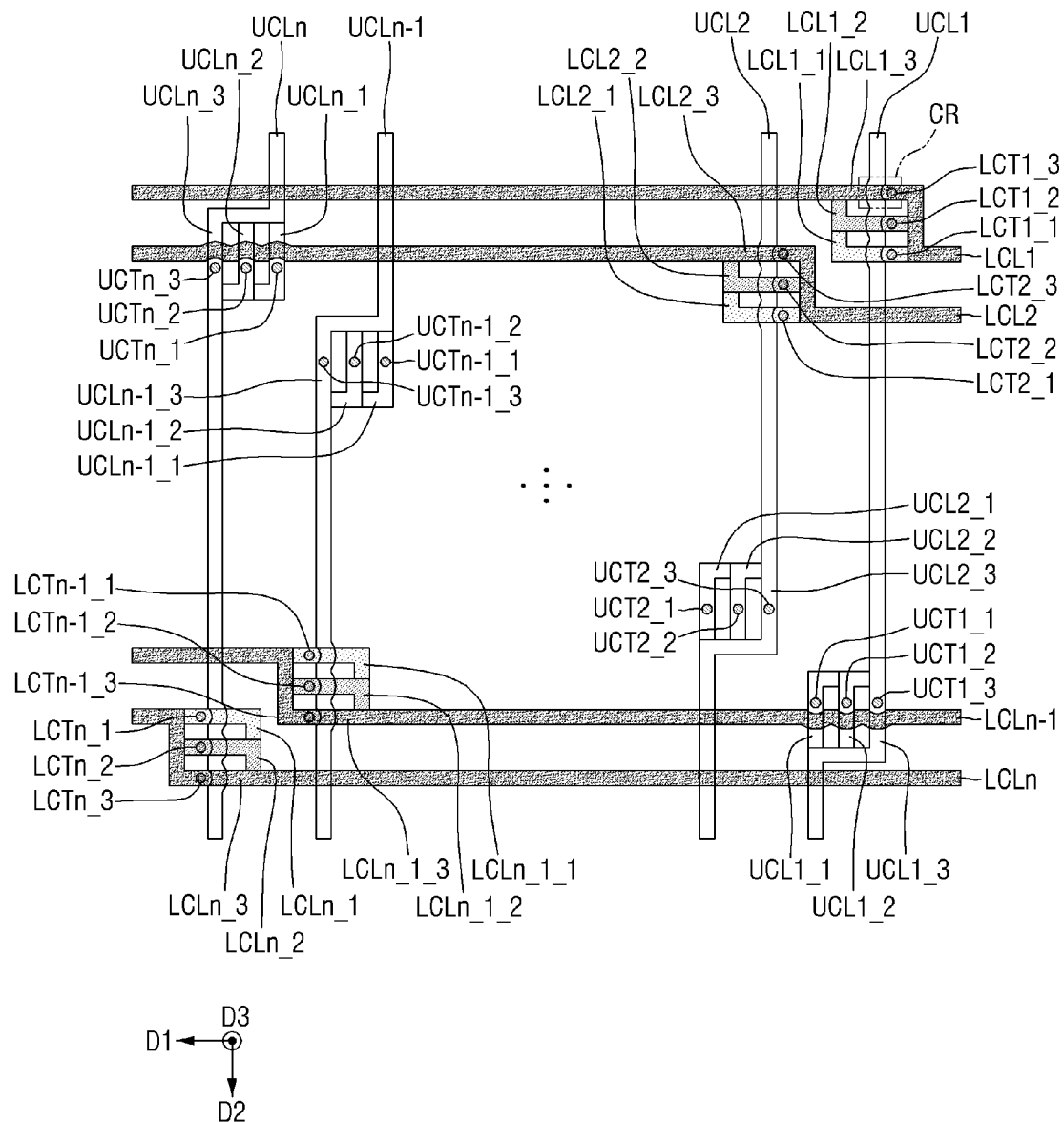

FIGS. 12 and 13 are layout diagrams of further variable resistance memory devices according to some embodiments. Hereinafter, a description of portions identical to the above descriptions will be omitted and differences therebetween will be mainly described.

Referring to FIG. 12, in contrast to the variable resistance memory device of FIG. 4 according to some embodiments, an arrangement of lower contacts LCT and/or upper contacts UCT may be changed, such that the lower contacts LCT and/or the upper contacts UCT are not aligned with each other.

More specifically, for example, lower contacts LCT1_1 to LCT1_3, which are disposed in a first lower conductive line branch region, may be alternately disposed based on or relative to a virtual line IL1 extending in a second direction D2. An example in which the lower contacts LCT are disposed is not limited thereto, and when viewed from a third direction D3, the lower conductive lines in which the lower contacts LCT do not overlap each other may be alternately disposed based on the virtual line IL1 in any form in the branch region.

As yet another example, upper contacts UCT1_1 to UCT1_3, which are disposed in a first upper conductive line branch region, may be alternately disposed based on or relative to a virtual line IL2 extending in the second direction D2. An example in which the upper contacts UCT are disposed is not limited thereto, and when viewed from the third direction D3, the upper conductive lines in which the upper contacts UCT do not overlap each other may be alternately disposed based on the virtual line IL2 in any form in the branch region.

Referring to FIG. 13, in contrast to the variable resistance memory device of FIG. 4 according to some embodiments, at least some conductive lines disposed closest to lower contacts LCT and/or upper contacts UCT may include a bent or non-linear portion CR having a curved shape.

More specifically, for example, the bent portion CR having the curved shape may be formed on at least a portion of a first upper conductive line UCL1 disposed closest to lower contacts LCT1_1 to LCT1_3. A curved surface of the bent portion CR may have a curved shape that corresponds to or otherwise follows a partial shape of the lower contacts LCT1_1 to LCT1_3 while being spaced apart from the lower contacts LCT1_1 to LCT1_3. The shape of the bent portion CR will be described in detail with reference to perspective views of FIGS. 14 and 15.

Figure 14:
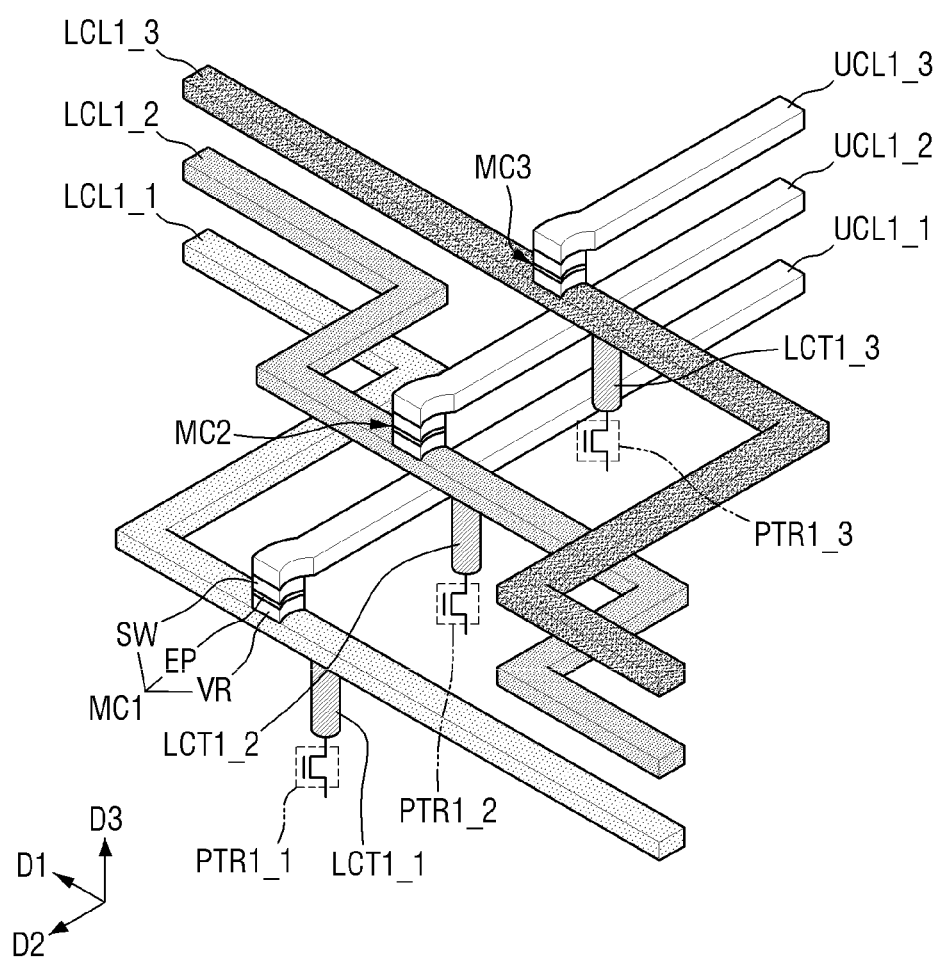
FIGS. 14 and 15 are example perspective views illustrating portions of the variable resistance memory device of FIG. 13.
Figure 15:
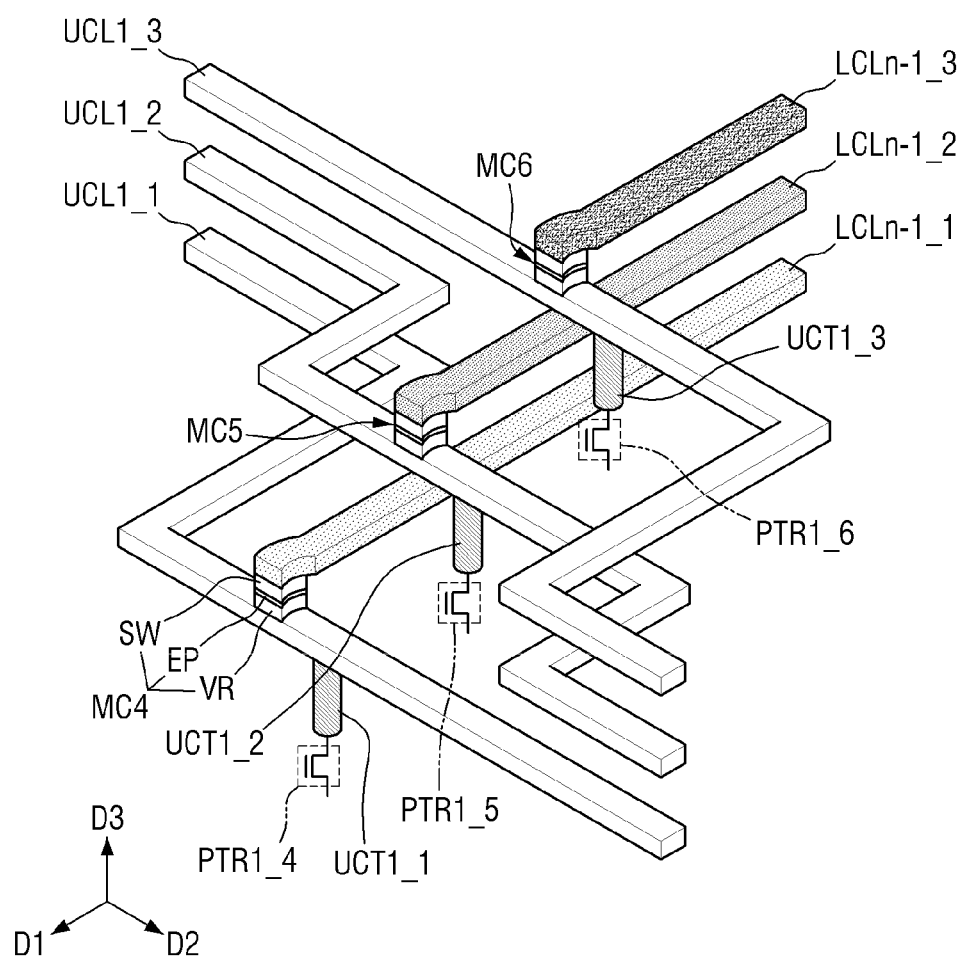

FIGS. 14 and 15 are example perspective views illustrating portions of the variable resistance memory device of FIG. 13.

Referring to FIGS. 13 and 14, the bent portion CR may be formed in at least a portion of each of the upper conductive lines UCL1_1 to UCL1_3 disposed closest to each of the lower contacts LCT1_1 to LCT1_3. The bent portions CR may extend on or overlap with the lower conductive lines LCL1 in the branch region LCL1_Div in the vertical direction D3.

In the variable resistance memory device according to some embodiments, a required margin may be secured due to the bent portion CR when a process of forming the lower contacts is performed even when the lower contacts are aligned with each other along a virtual line.

Referring to FIGS. 13 and 15, the bent portion CR may be formed in at least a portion of each of the lower conductive lines LCLn−1_1 to LCLn−1_3 disposed closest to each of the upper contacts UCT1_1 to UCT1_3. The bent portions CR may extend on or overlap with the upper conductive lines UCL1 in the branch region UCL1_Div in the vertical direction D3.

In the variable resistance memory device according to some embodiments, a required margin may be secured due to the bent portion CR when a process of forming the upper contacts is performed even when the upper contacts are aligned with each other along a virtual line.

In concluding the detailed description, those skilled in the art will appreciate that many variations and modifications may be made to the embodiments without substantially departing from the principles of the present inventive concept. Therefore, the disclosed embodiments of the invention are used in a generic and descriptive sense only and not for purposes of limitation.

What is claimed is:

1. A variable resistance memory device comprising:
lower conductive lines extending in a first direction on a substrate and spaced apart from each other in a second direction crossing the first direction;
peripheral transistors on the substrate and arranged under the lower conductive lines in a third direction crossing the first direction and the second direction; and
lower contacts electrically connecting the lower conductive lines to the peripheral transistors and extending in the third direction,
wherein each of the lower conductive lines comprises a first lower extending portion extending in the first direction, a second lower extending portion offset in the second direction from the first lower extending portion and extending in the first direction, and a lower connecting portion that couples the first lower extending portion to the second lower extending portion, and
wherein each of the lower contacts is on the lower connecting portion of a respective one of the lower conductive lines.

2. The variable resistance memory device of claim 1, further comprising:
upper conductive lines on the lower conductive lines and extending in the second direction; and
upper contacts electrically connecting the upper conductive lines to the peripheral transistors and extending in the third direction,
wherein each of the upper conductive lines comprises a first upper extending portion extending in the second direction, a second upper extending portion offset in the first direction from the first upper extending portion and extending in the second direction, and an upper connecting portion that couples the first upper extending portion to the second upper extending portion, and
wherein each of the upper contacts is on the upper connecting portion of a respective one of the upper conductive lines.

3. The variable resistance memory device of claim 2, wherein:
each of the lower contacts extends from the lower connecting portion of the respective one of the lower conductive lines to provide electrical connection to a respective one of the peripheral transistors in a lower conductive line branch region in which the lower connecting portions do not overlap in the third direction; and/or
each of the upper contacts extends from the upper connecting portion of the respective one of the upper conductive lines to provide electrical connection to a respective one of the peripheral transistors in an upper conductive line branch region in which the upper connecting portions do not overlap in the third direction.

4. The variable resistance memory device of claim 2, wherein at least some of the upper conductive lines closest to the lower contacts in the first direction include a non-linear portion having a curved shape.

5. The variable resistance memory device of claim 1, wherein the first lower extending portions of the lower conductive lines extend in parallel in the first direction and are spaced apart from each other in the third direction.

6. The variable resistance memory device of claim 5, wherein the second lower extending portions of the lower conductive lines extend in parallel in the first direction and are spaced apart from each other in the third direction.

7. The variable resistance memory device of claim 6, wherein the lower connecting portions of the lower conductive lines extend in parallel in the second direction and are spaced apart from each other in the second direction.

8. The variable resistance memory device of claim 1, wherein the lower contacts are aligned with one another along a virtual line extending in the second direction.

9. The variable resistance memory device of claim 1, wherein the lower contacts are alternately disposed relative to a virtual line extending in the second direction.

10. A variable resistance memory device comprising:
a peripheral circuit unit on a substrate and comprising peripheral transistors; and
a first cell stack and a second cell stack sequentially stacked on the peripheral circuit unit in a first direction,
wherein the first cell stack comprises a first lower conductive line including a first lower extending portion that extends in a second direction crossing the first direction, a second lower extending portion that is offset in a third direction crossing the first direction and the second direction from the first lower extending portion and extends in the second direction, and a first lower connecting portion that couples the first lower extending portion to the second lower extending portion, and a first lower contact that electrically connects the first lower conductive line to at least one of the peripheral transistors and extends in the first direction, wherein the first lower contact is on the first lower connecting portion.

11. The variable resistance memory device of claim 10, wherein the second cell stack comprises:
- a second lower conductive line including a third lower extending portion that extends in the second direction, a fourth lower extending portion that is offset in the third direction from the third lower extending portion and extends in the second direction, and a second lower connecting portion that couples the third lower extending portion to the fourth lower extending portion; and
- a second lower contact that electrically connects the second lower conductive line to at least one of the peripheral transistors and extends in the first direction,
- wherein the second lower contact is on the second lower connecting portion.

12. The variable resistance memory device of claim 11, wherein the first lower extending portion and the third lower extending portion extend in parallel and are spaced apart from each other in the first direction.

13. The variable resistance memory device of claim 12, wherein the second lower extending portion and the fourth lower extending portion extend in parallel and are spaced apart from each other in the first direction.

14. The variable resistance memory device of claim 10, wherein the first cell stack further comprises:
- a first upper conductive line including a first upper extending portion that extends in the third direction, a second upper extending portion that is offset in the second direction from the first upper extending portion and extends in the third direction, and a first upper connecting portion that couples the first upper extending portion to the second upper extending portion; and
- a first upper contact that electrically connects the first upper conductive line to at least one of the peripheral transistors and extends in the first direction,
- wherein the first upper contact is on the first upper connecting portion.

15. A variable resistance memory device comprising:
a peripheral circuit unit on a substrate and comprising peripheral transistors; and
a first cell stack and a second cell stack sequentially stacked on the peripheral circuit unit in a first direction,
wherein the first cell stack comprises a first lower conductive line including a first lower extending portion that extends in a second direction crossing the first direction, a second lower extending portion that is offset in a third direction crossing the first direction and the second direction from the first lower extending portion and extends in the second direction, and a first lower connecting portion that couples the first lower extending portion to the second lower extending portion, a first lower contact that electrically connects the first lower conductive line to at least one of the peripheral transistors and extends in the first direction, a first upper conductive line comprising a first upper extending portion that extends in the third direction, a second upper extending portion that is offset in the second direction from the first upper extending portion and extends in the third direction, and a first upper connecting portion that couples the first upper extending portion to the second upper extending portion, and a first upper contact that electrically connects the first upper conductive line to at least one of the peripheral transistors and extends in the first direction, wherein the first lower contact is on the first lower connecting portion, and the first upper contact is on the first upper connecting portion.

16. The variable resistance memory device of claim 15, wherein the second cell stack comprises:
- a second lower conductive line including a third lower extending portion that extends in the second direction, a fourth lower extending portion that is offset in the third direction from the third lower extending portion and extends in the second direction, and a second lower connecting portion that couples the third lower extending portion to the fourth lower extending portion; and
- a second lower contact that electrically connects the second lower conductive line to at least one of the peripheral transistors and extends in the first direction,
- wherein the second lower contact is on the second lower connecting portion.

17. The variable resistance memory device of claim 16, wherein the first lower extending portion and the third lower extending portion extend in parallel and are spaced apart from each other in the first direction.

18. The variable resistance memory device of claim 17, wherein the second lower extending portion and the fourth lower extending portion extend in parallel and are spaced apart from each other in the first direction.

19. The variable resistance memory device of claim 11, wherein the first and second lower contacts extend from the first and second lower connecting portions to provide electrical connection to first and second ones of the peripheral transistors, respectively, in a lower conductive line branch region in which the first and second lower connecting portions do not overlap in the first direction.

20. The variable resistance memory device of claim 16, wherein the first and second lower contacts extend from the first and second lower connecting portions to provide electrical connection to first and second ones of the peripheral transistors, respectively, in a lower conductive line branch region in which the first and second lower connecting portions do not overlap in the first direction.

* * * * *